(12) United States Patent
Adelmann

(10) Patent No.: US 7,164,646 B2
(45) Date of Patent: Jan. 16, 2007

(54) STORAGE DEVICE HAVING A STORAGE CELL PROGRAMMABLE TO ONE OF MORE THAN TWO STORAGE STATES

(75) Inventor: Todd C. Adelmann, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 556 days.

(21) Appl. No.: 10/782,626

(22) Filed: Feb. 19, 2004

(65) Prior Publication Data
US 2005/0185567 A1    Aug. 25, 2005

(51) Int. Cl.
*G11B 7/00* (2006.01)
(52) U.S. Cl. .................................. 369/126; 369/275.4
(58) Field of Classification Search ................ 369/126, 369/275.3, 275.4, 44.26
See application file for complete search history.

(56) References Cited

U.S. PATENT DOCUMENTS

| 5,039,583 | A | 8/1991 | Epstein et al. |
| 5,345,815 | A | 9/1994 | Albrecht et al. |
| 5,835,477 | A | 11/1998 | Binnig et al. |
| 5,856,967 | A | 1/1999 | Mamin et al. |
| 6,233,206 | B1 | 5/2001 | Hamann et al. |
| 6,370,107 | B1 * | 4/2002 | Hosaka et al. ........... 369/275.4 |
| 6,473,361 | B1 | 10/2002 | Chen et al. |
| 2002/0131297 | A1 | 9/2002 | Baumeister et al. |
| 2003/0133324 | A1 | 7/2003 | Baumeister et al. |

FOREIGN PATENT DOCUMENTS

| EP | 0 901 120 | 3/1999 |
| JP | 08-249731 | 9/1996 |
| WO | WO 97/25709 | 7/1997 |

OTHER PUBLICATIONS

GB Search Report, p. 1, dated Apr. 6, 2005.
Vettiger and Binnig, Scientific American, "The Nanodrive Project," pp. 47-51, 53 (Jan. 2003).
U.S. Appl. No. 10/619,199, entitled "Storage Device Having a Probe with Plural Tips," filed Jul. 14, 2003, by Todd C. Adelmann.
U.S. Appl. No. 10/640,393, entitled "Storage Device Having a Probe With a Tip to Form a Groove in a Storage Medium," filed Aug. 13, 2003, by Todd C. Adelmann.

* cited by examiner

Primary Examiner—Nabil Hindi

(57) ABSTRACT

A storage device includes a storage medium having plural storage cells, and a probe to scan across a surface of the storage medium to program the storage cells. The probe is adapted to selectively program each storage cell to one of more than two storage states.

31 Claims, 3 Drawing Sheets

STORAGE DEVICE HAVING A STORAGE CELL PROGRAMMABLE TO ONE OF MORE THAN TWO STORAGE STATES

BACKGROUND

In computing systems, such as desktop computers, portable computers, personal digital assistants (PDAs), servers, and others, storage devices are used to store data and program instructions. One type of storage device is a disk-based device, such as a magnetic disk drive (e.g., a floppy disk drive or hard disk drive) or an optical disk drive (e.g., a CD or DVD drive). Disk-based storage devices have a rotating storage medium with a relatively large storage capacity. However, disk-based storage devices offer relatively slow read-write speeds when compared to operating speeds of other components of a computing system, such as microprocessors and other semiconductor devices.

Another type of storage device is a solid state memory device, such as a dynamic random access memory (DRAM), static random access memory (SRAM), flash memory, and electrically erasable and programmable read-only memory (EEPROM). Although solid state memory devices offer relatively high read-write speeds, usually on the order of nanoseconds, they have relatively limited storage capacities.

With improvements in nanotechnology (technology involving microscopic moving parts), other types of storage devices are being developed. One such storage device is based on atomic force microscopy (AFM), in which microscopic scanning probes are used to read and write to a storage medium. Typically, each scanning probe has a tip that is contacted to a surface of the storage medium. Storage of data in the storage medium is based on perturbations created by the tip of the probe in the surface of the storage medium. In one implementation, a perturbation is a dent in the storage medium surface, with a dent representing a logical "1," and the lack of a dent representing a logical "0." Other types of perturbations that can be created in the surface of the storage medium include creating or altering the topographic features or composition of the storage medium, altering the crystalline phase of the medium, filling or emptying existing electronic states of the medium, creating or altering domain structures or polarization states in the medium, creating or altering chemical bonds in the medium, employing the tunneling effects to move and remove atoms or charge to or from the medium, or storing/removing charge from a particular region.

The perturbations are created in regions of the storage medium defined as storage cells. Typically, each storage cell is programmable to one of two states, such as a logical "0" and "1" state. The density of storage cells that can be provided in a storage medium is defined by the available size of the storage medium and the spacing between storage cells. The cost per bit of storage is driven by the density of storage cells in a storage device. Thus, a lower density of storage cells in a storage device usually leads to higher cost per bit of storage.

DETAILED DESCRIPTION

Figure 1:
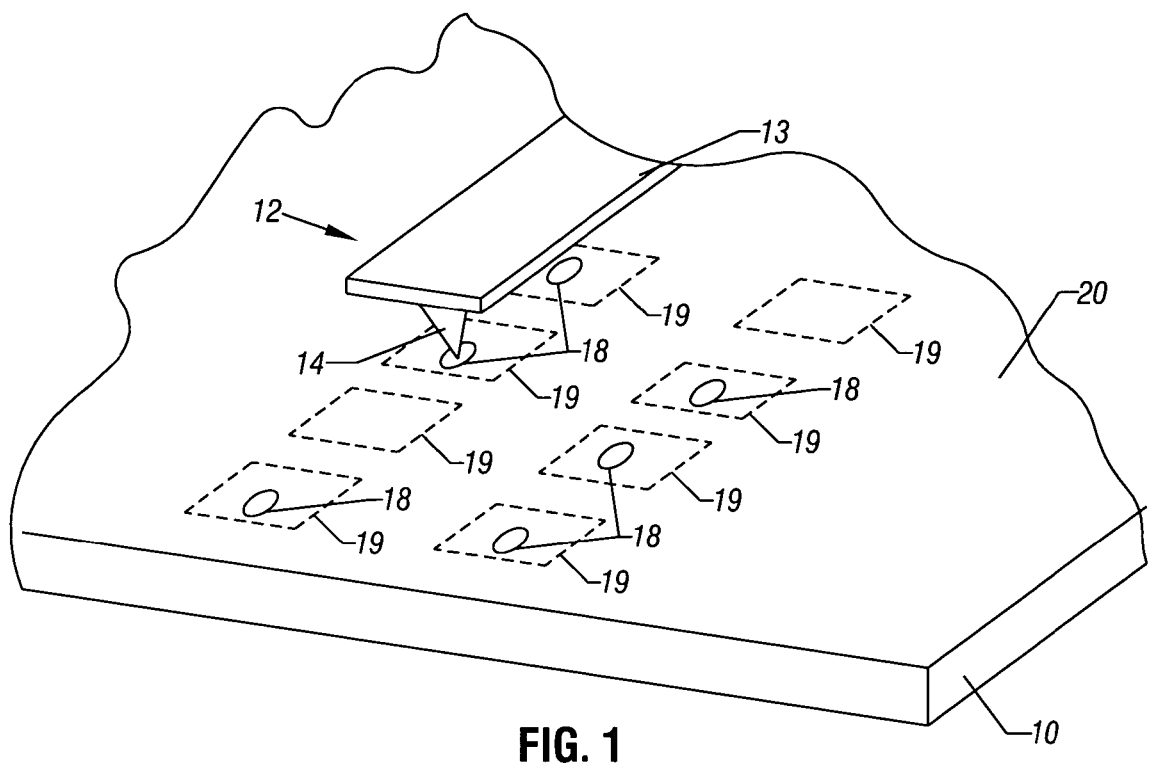
FIG. 1 illustrates a portion of a probe-based storage device that includes a storage substrate defining a storage medium in which storage cells are formed, with each storage cell programmable to more than two states, in accordance with some embodiments of the invention.

FIG. 1 shows an example probe-based storage device that includes a storage substrate 10 that provides a storage medium. As used here, the term "storage medium" refers to any medium in which storage cells are capable of being formed. The storage medium can make up a portion of the storage substrate 10, or the storage medium can be considered to be the whole storage substrate 10. The storage medium has a storage surface 20 on which perturbations can be formed by a tip 14 of a probe 12. According to some embodiments, the probe 12 is a very small probe (on the order of micrometers, nanometers, or even smaller) that is built using nanotechnology techniques. Such a probe is referred to as a microscopic probe or a nanotechnology probe.

The tip 14 of the probe 12 is attached to and extends outwardly from a cantilever 13 of the probe 12. Note that in some embodiments, multiple probes (such as an array of probes) are provided in the probe-based storage device. Each probe 12 is formed from a probe substrate that is positioned in a plane that is generally parallel to the storage substrate 10. The probe tips (if multiple probes are provided) protrude from the main surface of the probe substrate to enable the tips to contact the storage surface 20.

As shown in FIG. 1, dents 18 (which are basically pits or holes) are formed in the storage surface 20 of the storage medium. In this embodiment, the material providing the surface 20 of the storage medium is formed of a relatively soft material, such as polymer (e.g., PMMA or polymethylmethacrylate). In other embodiments, the material providing the storage surface 20 of the storage medium can be a liquid crystal, a phase change material, or any other suitable material (in which dents or other types of perturbations can be formed). In one implementation, the layer made of the soft material can be formed over the rest of the storage substrate 10, with the top layer defining the storage surface 20. Alternatively, the entire substrate 10 can be formed of the soft material.

To create each dent 18, the probe tip 14 is locally heated to a predetermined temperature (e.g., up to about 400° C. or greater) for some amount of time. The heat from the tip 14 melts the storage surface 20 at the contact point of the tip 14. When a downward force is applied onto the probe 12, the tip 14 imprints a dent 18. The applied downward force can be an incremental, applied downward force, or alternatively, a constant downward force due to the elastic nature of the cantilever 13. The device can be assembled such that the cantilever 13 is bent back a little and thus applies constant force on the storage surface 20.

The region in which each dent 18 can be formed defines a storage cell 19. In FIG. 1, eight storage cells 19 are illustrated. However, it is noted that the storage device can include many more storage cells. As depicted in FIG. 1, some of the storage cells 19 are programmed with dents by the probe 12, while other storage cells 19 are not programmed with dents.

In accordance with some embodiments of the invention, each storage cell 19 is programmable to more than two storage states. As used here, "storage state" refers to a state of the storage cell for representing a data value. The absence of a dent 18 in a storage cell represents a first storage state. To represent other states, the dent 18 can be selectively formed to have one of multiple different depths. Each of the multiple depths of the dent corresponds to a respective storage state. Thus, for example, each dent 18 can be formed to have three possible depths. The dent 18 having a first depth corresponds to a second storage state, the dent 18 having a second depth corresponds to a third storage state, and the dent 18 having a third depth corresponds to a fourth storage state.

Effectively, in this example implementation, each storage cell 19 is programmable to four storage states, which can effectively represent two binary data bits. Thus, in the above example, each storage cell 19 can represent a logical "00" state, a logical "01" state, a logical "10" state, and a logical "11" state.

In other implementations, each dent 18 can have two possible depths, or more than three possible depths. The ability of each storage cell being able to store more than one bit of data increases the density of storage bits in the probe-based storage device. By increasing the density of the storage device, manufacturing efficiency is enhanced and the cost per bit of storage can be reduced.

Once dents are formed, they can be erased by also using the probe tip 14. During erase, the tip 14 engages the dent 18, with the tip being heated locally to melt the material surrounding the dent 18 such that the material flows into the dent to remove the dent. Heating of the tip 14 can be achieved in one of several ways. For example, an electrical pulse can be sent along a conductor through the cantilever 13 to the tip 14, which causes resistive heating at the tip 14 when current flows through a heating element (e.g., a resistor) at the tip 14. Alternatively, laser beams or other heat sources can be used to perform heating. In another embodiment, heat sources can be provided below the storage medium to perform erasing of dents.

Instead of a dent formed in a storage cell 19 by the tip 14 of the probe 12, other types of perturbations can be created in each storage cell 19. Perturbations can include, but are not limited to, the following: creating or altering the composition of the storage medium; altering the crystalline phase of the medium; filling or emptying the existing electronic states of the medium; creating or altering domain structures or polarization states in the medium; creating or altering chemical bonds in the medium; employing tunneling effects to move and remove atoms or charge to or from the medium; or storing/removing charge from a particular region.

Thus, more generally, in accordance with some embodiments of the invention, a perturbation created by a probe tip in a storage cell can have one of more than two possible storage states to enable representation of greater than one data bit by each storage cell. The probe is able to create a perturbation in each storage cell to selectively have at least two properties for representing at least two corresponding storage states, in addition to a first storage state represented by absence of the perturbation in a storage cell.

Figure 2:
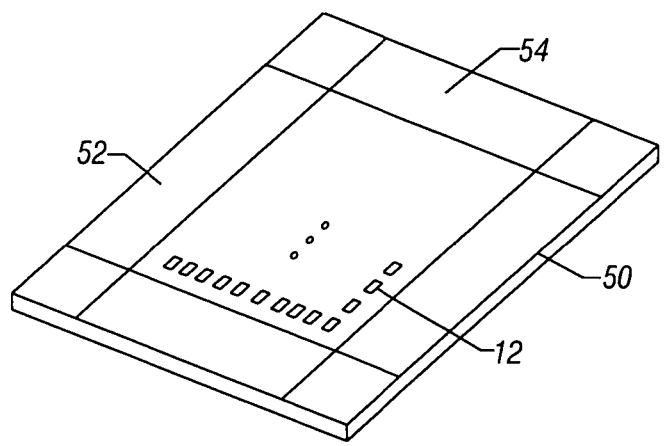
FIG. 2 is a schematic diagram of a probe substrate containing an array of probes and peripheral circuitry to interact with such probes, the probe substrate and probes being in the storage device of FIG. 1.

FIG. 2 illustrates a probe substrate 50, which includes an array of probes 12 formed in the substrate 50. Peripheral circuitry 52 and 54 are provided on the peripheral sides of the probe substrate 50. For example, peripheral circuitry 52 and 54 can drive X and Y select lines to select bits of the storage array to read from or write to. A row of probes 12 may be activated by the select lines to read from or write to storage cells that the probes are in contact with. This structure enables concurrent access of multiple cells in one operation, which improves access speeds. Alternatively, one of the probes may be activated to read from or write to a storage cell. The peripheral circuitry 52 and 54 also include sensing devices and decoders to detect analog signals from the probes and to convert the analog signals to a digital representation of data bits.

Figure 3:
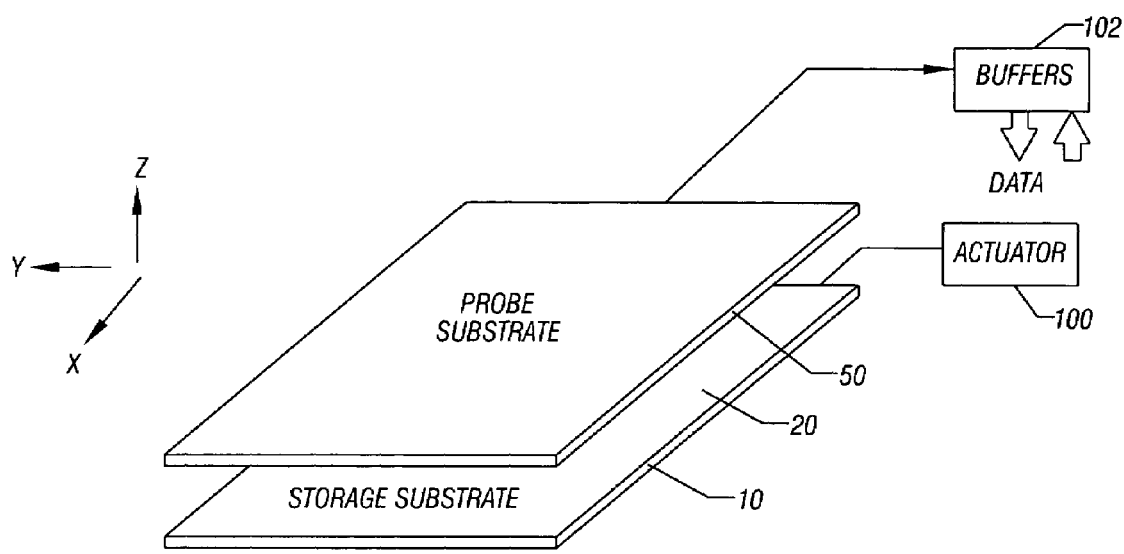
FIG. 3 illustrates the probe substrate positioned to face the storage substrate in the probe-based storage device of FIG. 1.

As shown in FIGS. 1 and 3, the probe substrate 50 is placed with the surface containing the probes 12 facing the storage surface 20 of the storage substrate 10, on which storage cells are formed. The probe substrate 50 is positioned over the storage substrate 10 so that each probe tip 14 (FIG. 1) points downwardly to engage the storage surface 20 of the storage substrate 10. In an alternative arrangement, the storage substrate 10 is positioned over the probe substrate 50 so that the probe tip 14 points upwardly to face the storage surface 20. In other arrangements, the probe substrate 50 and the storage substrate 10 can be positioned laterally or diagonally.

The storage substrate 10, in the example of FIG. 3, is coupled to an actuator 100 that is designed to move the storage substrate 10 in both X and Y directions such that probes 12 (FIG. 1) can be placed over desired storage cells on the storage substrate 10. Data sensed by the probes 12 is provided to buffers 102, which store output data for retrieval by an external device. The buffers 102 may also store write data to be written to storage cells 19 (FIG. 1) in the storage substrate 10.

Alternatively, the actuator 100 is operatively coupled to move the probe substrate 50, or to move both the probe substrate 50 and the storage substrate 10. The actuator 100 is also able to move the probe substrate 50 and/or the storage substrate 10 in the Z direction, which is generally perpendicular to the X and Y directions.

Figure 4:
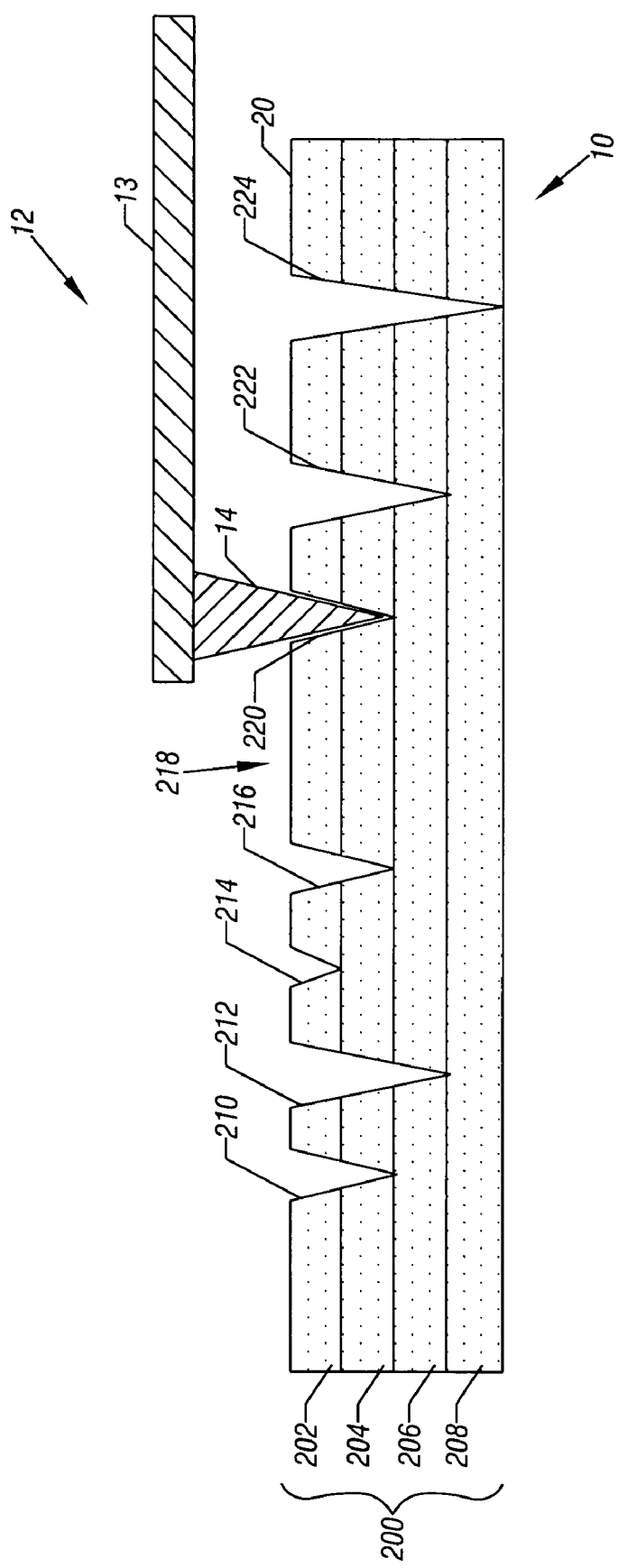
FIG. 4 is a cross-sectional view of a probe and several storage cells formed in the storage medium, in accordance with an embodiment of the invention.

FIG. 4 is a cross-sectional view of a portion 200 of the storage substrate 10 that is adjacent the storage surface 20. The storage substrate portion 200 includes four layers, each having a different characteristic to enable selective formation of dents to different depths in the storage substrates portion 200. In one embodiment, the layers 202, 204, 206 and 208 have different melting points. The first layer 202 (which is the layer closest to the storage surface 20 of the storage substrate 10) has a first melting point. The second layer 204 has a second melting point that is greater than the first melting point. The third layer 206 has a third melting point that is greater than the second melting point. The fourth layer 208 has a fourth melting point that is greater than the third melting point. Effectively, a deeper layer (a layer of the storage substrate portion 200 farther away from the storage surface 20) has a higher melting point than a shallower layer (a layer closer to the storage surface 20).

The different melting points of the layers 202, 204, 206, and 208 enable the probe 14 to selectively form dents of different depths in the storage substrate portion 200. Thus, if the probe tip 14 is heated to a first temperature that is greater than the first melting point but lower than the second melting point, then a dent is formed in the layer 202 but not in the other layers 204, 206, and 208. An example of such a dent is dent 214 depicted in FIG. 4. If the probe tip 14 is heated to a temperature that is greater than the second melting point but less than the third melting point, then a dent is formed through layers 202 and 204. Examples of such dents include dents 210, 216, and 220.

Similarly, if the probe tip 14 is heated to a temperature that is greater than the third melting point but less than the fourth melting point, then a dent is formed through layers 202, 204 and 206. Examples of such dents include dents 212 and 222. If the probe tip 14 is heated to a temperature that is greater than the fourth melting point, then a dent is formed through all four layers 202, 204, 206, and 208 (such as dent 224 shown in FIG. 4). Each of the dents 210, 212, 214, 216, 220, 222, and 224 make up respective individual storage cells. FIG. 4 also shows a storage cell (indicated by 218) in which a dent has not been formed.

In an alternative embodiment, instead of selecting different melting points for the layers 202, 204, 206 and 208, the layers can be selected to have different tensile strengths. In this alternative implementation, the layer 202 is selected to have a first tensile strength, the layer 204 is selected to have a second tensile strength (greater than the first tensile strength), the layer 206 is selected to have a third tensile strength (greater than the second tensile strength), and the layer 208 is selected to have a fourth tensile strength (greater than the third tensile strength). The tensile strength of a layer refers to the stress that the layer can withstand without breaking or permanently deforming.

In this implementation, a first force can be applied by the probe tip 14 (through the cantilever 13) such that the probe tip 14 can break through or deform the first layer 202 but not the second layer 204 to form a dent having a first depth in the first layer 202. A second, larger force applied by the probe tip 14 onto the storage substrate portion 200 can break through the first and second layers 202 and 204 but not the third layer 206 to form a dent having a second depth in the first and second layers. A third force larger than the second force applied by the probe tip causes the probe tip to break through the first, second, and third layers 202, 204, and 206, but not the fourth layer 208, to form a dent having a third depth. A fourth force larger than the third force causes the probe tip to break through all four layers 202, 204, 206, and 208 to form a dent having a fourth depth.

As noted above, formation of dents in storage cells using either technique is performed during a write operation. To read the storage cells, the tip 14 of the probe 12 is scanned across the surface 20 of the storage medium. As the probe tip 14 is dragged across the surface 20, the probe tip will deflect into each dent 18 as the probe tip crosses the dent.

In one implementation, during a read operation, the probe tip 14 is heated to a temperature that is lower then the write temperature. When the heated probe tip encounters a dent, the probe tip transfers heat to the material of the surface 20 and electrical resistance falls. This reduction in electrical resistance is detected by peripheral circuitry 52 and 54 (FIG. 2). In an alternative implementation, detection of the engagement of the probe tip 14 in the dent 18 is based on measurement of the deflection of the cantilever 13 in response to the probe tip engaging the dent. The detection of the cantilever 13 in response to the probe tip engaging the dent. The detection of the cantilever deflection is performed by a piezoresistive resistor can be provided at the fixed base of the cantilever 13.

If no dent is present in a storage cell, the probe 12 is not deflected, and the sensing device and decoder in the peripheral circuitry 52 and 54 detect that the storage cell has a first state. However, if the probe tip 14 drops into a dent of a storage cell, then the sensing device and decoder detect for the amount of deflection of the probe 12. If the sensing device and decoder detect that the probe tip 14 is detected to have dropped by a first depth, then a second storage state is indicated. However, if the probe tip 14 has dropped by other depths, then the sensing device and decoder indicate other corresponding storage states.

Figure 5:
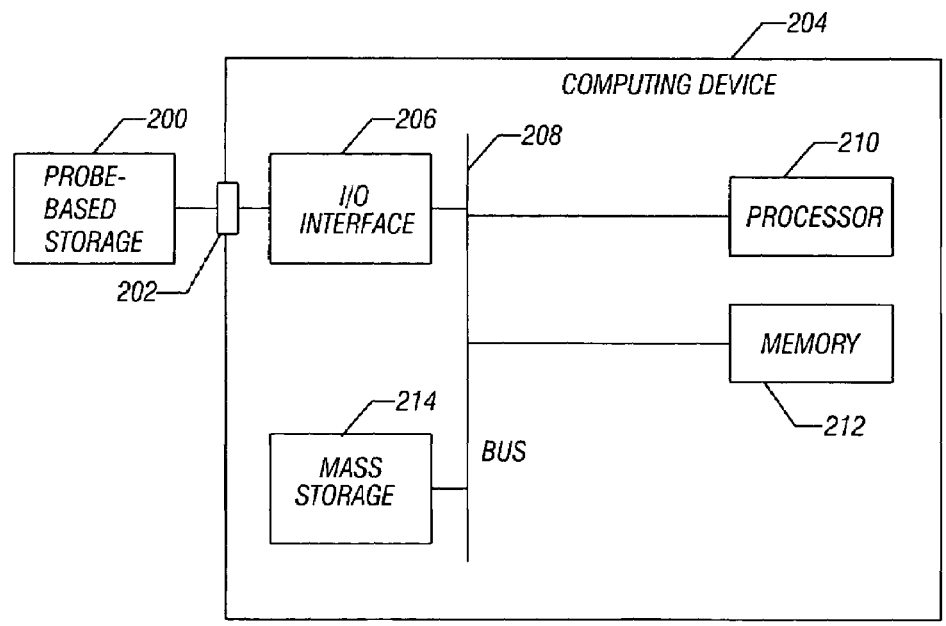
FIG. 5 is a block diagram of a system that includes a computing device having a port to connect to a probe-based storage device.

The probe-based storage device can be packaged for use in a computing system. For example, as shown in FIG. 5, a probe-based storage device 200 incorporating an embodiment of the invention is attached to or connected to an I/O (input/output) port 202 of a computing device 204. The I/O port 202 can be a USB port, a parallel port, or any other type of I/O port. Inside the computing device 204, the I/O port 202 is connected to an I/O interface 206, which in turn is coupled to a bus 208. The bus 208 is coupled to a processor 210 and memory 212, as well as to mass storage 214. Other components may be included in the computing device 204. The arrangement of the computing device 204 is provided as an example, and is not intended to limit the scope of the invention. In alternative embodiments, instead of being coupled to an I/O port of the computing system, the probe-based storage device 200 can be mounted onto the main circuit board (directly or through a socket) of the computing system.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A storage device comprising:
  a storage medium having plural storage cells; and
  a probe to scan across a surface of the storage medium to program the storage cells,
  wherein the probe is adapted to selectively program each storage cell to one of more than two storage states, the probe to selectively program each storage cell to have a dent having one of plural depths that represent at least two of the storage states, and
  wherein the probe is operable to contact a surface of the storage medium to read a storage state of at least one storage cell during a read operation.

2. The storage device of claim 1, wherein absence of a perturbation in a storage cell represents one other, different storage state.

3. The storage device of claim 2, wherein the perturbation comprises a dent, and wherein the probe is adapted to selectively form the dent to have one of at least two depths for representing the at least two storage states.

4. The storage device of claim 3, wherein absence of the dent in a storage cell represents the one other storage state.

5. A storage device comprising:
  a storage medium having plural storage cells; and
  a probe to scan across a surface of the storage medium to program the storage cells,
  wherein the probe is adapted to selectively program each storage cell to one of more than two storage states.
  wherein the probe is adapted to program at least one of the storage cells by generating a perturbation in the at least one storage cell,
  the probe to selectively cause the perturbation to have one of at least two properties for representing at least two corresponding storage states, wherein the storage medium has plural layers, the plural layers having different characteristics to enable selective creation of the perturbation to have one of the at least two properties.

6. The storage device of claim 5, wherein the plural layers have different melting points.

7. The storage device of claim 6, wherein the perturbation comprises a dent, and
wherein the probe has a tip heatable to different temperatures to enable formation of the dent having different depths by melting through selected one or more of the plural layers.

8. The storage device of claim 7, wherein the dent having a first depth represents a first storage state, and the dent having a second depth represents a second state, and
wherein absence of the dent in a storage cell represents a third storage state.

9. The storage device of claim 8, wherein the dent having a third depth represents a fourth storage state.

10. The storage device of claim 5, wherein the plural layers have different tensile strengths.

11. The storage device of claim 10, wherein the perturbation comprises a dent, and
wherein the probe is adapted to apply different forces to enable formation of the dent having different depths by breaking through or deforming selected one or more of the plural layers.

12. The storage device of claim 1, wherein the storage medium and probe are moveable with respect to each other to enable the probe to scan across the surface of the storage medium.

13. The storage device of claim 12, further comprising an actuator to move the storage medium.

14. A system comprising:
a processor;
a storage device comprising:
a storage medium; and
a probe to selectively form a dent to have one of at least two depths in the storage medium,
wherein absence of the dent represents a first storage state, and the at least two depths of the dent represent at least two other storage states,
the probe to contact a surface of the storage medium to perform a read.

15. The system of claim 14, wherein the storage medium contains plural storage cells, and the probe is adapted to form a dent having a first one of the depths in a first storage cell, and to form a dent having a second one of the depths in a second storage cell.

16. The system of claim 15, wherein another one of the storage cells does not have a dent.

17. The system of claim 14, wherein the storage medium has plural layers, the plural layers having different melting points to enable selective formation of the dent to one of the at least two depths.

18. The system of claim 17, wherein the probe is heatable to a first temperature to form the dent to have a first depth, and the probe is heatable to a second, greater temperature to form the dent to have a second depth greater than the first depth.

19. The system of claim 18, wherein the probe is heatable to a third temperature greater than the first temperature to form the dent to have a third depth greater than the second depth.

20. The system of claim 14, wherein the storage medium has plural layers, the plural layers having different tensile strengths to enable selective formation of the dent to one of the at least two depths.

21. The system of claim 20, wherein the probe is adapted to apply a first force to form the dent to have a first depth, and wherein the probe is adapted to apply a second, greater force to form the dent to have a second depth greater than the first depth.

22. The system of claim 14, wherein the dent includes a first dent, and wherein the storage device includes at least another probe to selectively form a second dent in the storage medium to have one of at least two depths,
wherein the storage medium defines plural storage cells, the first dent formed in a first one of the storage cells, and the second dent formed in a second one of the storage cells.

23. The system of claim 14, wherein the probe comprises a nanotechnology probe.

24. A method of storing data, comprising:
storing data in storage cells defined in a storage medium;
programming, with a probe, the storage cells to respective storage states,
wherein each storage cell is selectively programmable by the probe to one of more than two storage states by selectively programming the storage cell to have a dent having one of plural depths that represent at least two of the storage states; and
during a read operation, contacting the probe to a surface of the storage medium to read a storage state of at least one storage cell.

25. A method of storing data, comprising:
storing data in storage cells defined in a storage medium; and
programming, with a probe, the storage cells to respective storage states,
wherein each storage cell is selectively programmable by the probe to one of more than two storage states,
wherein programming the storage cells comprises forming a perturbation in at least one storage cell,
wherein forming the perturbation comprises selectively forming the perturbation to have one of at least two properties for representing at least two corresponding storage states,
wherein the storage medium has plural layers having different characteristics,
wherein selectively forming the perturbations to have one of the at least two properties is based on the different characteristics of the plural layers.

26. The method of claim 24, further comprising the probe programming another one of the storage cells by not forming a dent in the another one of the storage cells,
wherein absence of a dent in the another one of the storage cells represents another storage state different from the at least two storage states.

27. The method of claim 25, wherein forming the perturbation comprises forming a dent.

28. The method of claim 27, wherein forming the dent comprises selectively forming the dent to have one of at least two depths for representing the at least two storage states.

29. The method of claim 27, wherein forming the dent comprises forming the dent to selectively have at least one of three depths.

30. The method of claim 24, further comprising the probe engaging a dent of a storage cell during the read operation.

31. The storage device of claim 1, wherein absence of a dent in a storage cell represents one other, different storage state.

* * * * *

UNITED STATES PATENT AND TRADEMARK OFFICE
CERTIFICATE OF CORRECTION

PATENT NO. : 7,164,646 B2 Page 1 of 1
APPLICATION NO. : 10/782626
DATED : January 16, 2007
INVENTOR(S) : Todd C. Adelmann It is certified that error appears in the above-identified patent and that said Letters Patent is hereby corrected as shown below:

In column 6, line 46, in Claim 2, delete "claim 1," and insert -- claim 5, --, therefor.

In column 6, line 61, in Claim 5, delete "states." and insert -- states, --, therefor.

Signed and Sealed this

Tenth Day of March, 2009

JOHN DOLL
*Acting Director of the United States Patent and Trademark Office*